US012679424B2

(12) United States Patent　　　　(10) Patent No.:　US 12,679,424 B2
Park　　　　　　　　　　　　　　　　(45) Date of Patent:　　Jul. 14, 2026

(54) APPARATUS FOR TRANSPORTING ARTICLE

(71) Applicant: SEMES CO., LTD., Cheonan-si (KR)

(72) Inventor: Nojae Park, Seoul (KR)

(73) Assignee: Semes Co., Ltd., Cheonan-si (KR)

( * ) Notice: Subject to any disclaimer, the term of this patent is extended or adjusted under 35 U.S.C. 154(b) by 799 days.

(21) Appl. No.: 18/066,681

(22) Filed: Dec. 15, 2022

(65) Prior Publication Data

US 2023/0192152 A1　　Jun. 22, 2023

(30) Foreign Application Priority Data

Dec. 21, 2021　(KR) ......................... 10-2021-0183489
May 12, 2022　(KR) ......................... 10-2022-0058129

(51) Int. Cl.
B61B 13/00　　　　(2006.01)
H10P 72/30　　　　(2026.01)
(52) U.S. Cl.
CPC .......... B61B 13/00 (2013.01); H10P 72/3221 (2026.01)
(58) Field of Classification Search
CPC .. B61B 3/00; B61B 3/02; B61B 13/00; B61B 13/02; H01L 21/67733
See application file for complete search history.

(56) References Cited

FOREIGN PATENT DOCUMENTS

| CN | 113056406　A | 6/2021 |
|---|---|---|
| DE | 202021000168　U1 | 1/2021 |
| JP | 2009-223561　A | 10/2009 |
| JP | 2013-126913　A | 6/2013 |
| JP | 2019093875　A　* | 6/2019　............... B61J 1/06 |
| KR | 10-2013-0070543　A | 6/2013 |
| KR | 10-2014-0087293　A | 7/2014 |
| KR | 10-2017-0026176　A | 3/2017 |
| KR | 102254282　B1 | 5/2021 |
| KR | 10-2021-0069682　A | 6/2021 |
| KR | 10-2021-0093730　A | 7/2021 |

OTHER PUBLICATIONS

Office Action for Japanese Application No. 2022-199209 dated Dec. 5, 2023 (with English translation).
First Office Action issued Jul. 26, 2025 in Chinese Application No. 202211653679.5.

* cited by examiner

*Primary Examiner* — Robert J McCarry, Jr.
(74) *Attorney, Agent, or Firm* — Harness, Dickey & Pierce, P.L.C.

(57)　　　　　　ABSTRACT

An article transport apparatus includes a traveling portion configured to travel along a rail portion and a mounting portion configured to have a structure suspended under a traveling portion to mount articles thereon, in particular, the rail portion includes a plurality of first straight rails extending in a first direction while being arranged parallel to each other at first intervals, a plurality of second straight rails extending in a second direction perpendicular to the first direction while being arranged parallel to each other at second intervals, and a connecting rail configured to connect between the first straight rails and the second straight rails, which perpendicularly face each other, so that the traveling portion travels between the first straight rails and the second straight rails perpendicularly facing each other.

20 Claims, 6 Drawing Sheets

APPARATUS FOR TRANSPORTING ARTICLE

CROSS-REFERENCE TO RELATED APPLICATION

This application claims priorities under 35 USC § 119 to Korean Patent Application No. 10-2021-0183489 filed on Dec. 21, 2021 and Korean Patent Application No. 10-2022-0058129 filed on May 12, 2022 in the Korean Intellectual Property Office (KIPO), the entire disclosures of which are incorporated herein by reference.

BACKGROUND

1. Field

The present disclosure relates to an article transport apparatus. More specifically, the present disclosure relates to an article transport apparatus used for transporting articles in the process of manufacturing integrated circuit devices such as semiconductor devices, display devices, and the like.

2. Description of the Related Art

In the manufacturing process for integrated circuit devices such as semiconductor devices and display devices, a transport process for articles such as FOUP for accommodating a plurality of substrates may be frequently performed. Recently, an article transport apparatus such as OHT (overhead hoist transport) provided on the ceiling of the manufacturing line of the integrated circuit devices has been used.

An article transport apparatus such as OHT may include a rail portion in the form of a straight rail, a curved rail, or the like, a traveling portion traveling along the rail portion, and a mounting portion having a structure suspended under the traveling portion for mounting an article. In particular, the transport of the article may be achieved by the vertical ascent and descent of the mounting portion between the ceiling and the floor. In addition, an apparatus for manufacturing integrated circuit devices may be provided with a plurality of ports where articles are loaded and unloaded, and a stocker for storing articles may have a plurality of shelves where articles are loaded and unloaded. Thus, the article transport apparatus such as OHT may transport the articles as the mounting portion ascends and descends between the port and the shelf.

However, if the position where the mounting portion vertically ascends and descends does not match to the position of the port or the shelf, the articles may not be accurately loaded to and unloaded from the port or the shelf, resulting in defective articles during the article transport. Therefore, when the manufacturing line for the integrated circuit device is initially set, it is necessary to perform a process for accurately matching the position where the mounting portion vertically ascends and descends to the position of the port and the shelf, and it is also necessary to frequently check and adjust the position where the mounting portion vertically ascends and descends with respect to the position of the port and the shelf.

However, in association with the process for accurately matching the position where the mounting portion vertically ascends and descends to the position of the port and the shelf, there is a disadvantage in that an additional time is necessary separately from the process time. In addition, when replacing the apparatus for manufacturing the integrated circuit devices, the stocker, and the like, not only the size of the apparatus for manufacturing the integrated circuit devices, the stocker, and the like may be changed in comparison with the size of the existing apparatus for manufacturing the integrated circuit devices, the existing stocker, and the like, but also the position of the port and the shelf may be changed. In this case, since the travel path of the mounting portion may deviate from the range directly below the port or the shelf, it may be necessary to adjust the travel path of the mounting portion within the range directly below the port or shelf or to adjust the position of the port or the shelf within the range below the travel path of the mounting portion.

SUMMARY

It is an object of the present disclosure is to provide an article transport apparatus capable of matching a position where a mounting portion vertically ascends and descends to a position of a port and a shelf without performing a process for accurately matching the position where the mounting portion vertically ascends and descends to the position of the port and the shelf.

In order to accomplish the object of the present disclosure, an article transport apparatus according to example embodiments of the present disclosure includes a traveling portion configured to travel along a rail portion and a mounting portion configured to have a structure suspended under a traveling portion to mount articles thereon, wherein the rail portion includes a plurality of first straight rails extending in a first direction while being arranged parallel to each other at first intervals, a plurality of second straight rails extending in a second direction perpendicular to the first direction while being arranged parallel to each other at second intervals, and connecting rails configured to connect between the first straight rails and the second straight rails, which perpendicularly face each other, so that the traveling portion travels between the first straight rails and the second straight rails perpendicularly facing each other.

In example embodiments, when the connecting rail is configured to have a path extending over the first straight rail and over the second straight rail, which perpendicularly face each other, the traveling portion may include a traveling wheel traveling along the first straight rail and the second straight rail, and a steering wheel traveling along the connecting rail, and the steering wheel may be configured to be connected to the connecting rail through upward movement and to travel along the connecting rail in a desired direction through a lateral movement.

In example embodiments, when the connecting rail includes a branch rail branching from the first straight rail to extend to the second straight rail perpendicularly facing the first straight rail or branching from the second straight rail to extend to the first straight rail perpendicularly facing the first straight rail, and a steering rail disposed in a branch area branching from the first straight rail or a branch area branching from the second straight rail such that the traveling portion enters the branch rail from the first straight rail or enters the branch rail from the second straight rail, the traveling portion may include a traveling wheel traveling along the first straight rail, the second straight rail, and the branch rail, and a steering wheel traveling along the steering rail.

In example embodiments, when the steering rail is configured to be disposed above the branch rail, the steering wheel may be connected to the steering rail through upward movement and travel along the steering rail in a desired direction through lateral movement.

In example embodiments, the connecting rail may be configured to connect between the first straight rail and the second straight rail which are perpendicularly adjacent to each other.

In example embodiments, the connecting rail may be configured to connect between a point of about ½ length of the first straight rail and a point of about ½ length of the second straight rail, which are perpendicularly adjacent to each other.

In example embodiments, the mounting portion may be configured to have a structure that is movably suspended by a guide portion disposed under the traveling portion.

In example embodiments, the guide portion may include a guide plate configured to be connected to the traveling portion and to have a guide groove adjacent to the mounting portion, and a guide rod configured to be connected to the mounting portion and to move along the guide groove.

In example embodiments, the guide groove may be configured to have a structure extending from a center of the guide plate toward both ends of the guide plate, in which at least two guide grooves may extend toward the both ends of the guide plate from the center of the guide plate.

In example embodiments, the first interval may be equal to the second interval.

In order to accomplish the object of the present disclosure, an article transport apparatus according to example embodiments of the present disclosure includes a traveling portion configured to travel along a rail portion, and a mounting portion configured to have a structure suspended under a traveling portion to mount articles thereon, wherein the rail portion includes a plurality of first straight rails extending in a first direction while being arranged parallel to each other at first intervals, a plurality of second straight rails extending in a second direction perpendicular to the first direction while being arranged parallel to each other at second intervals, and a connecting rail configured to connect between the first straight rails and the second straight rails, which perpendicularly face each other, to form a curved path between the first straight rails and the second straight rails so that the traveling portion travels between the first straight rails and the second straight rails perpendicularly facing each other.

In example embodiments, when the connecting rail is configured to have a curved path extending over the first straight rail and over the second straight rail, which perpendicularly face each other, the traveling portion may include a traveling wheel traveling along the first straight rail and the second straight rail, and a steering wheel traveling along the connecting rail, and the steering wheel may be configured to be connected to the connecting rail through upward movement and to travel along the connecting rail in a desired direction through lateral movement.

In example embodiments, when the connecting rail includes a branch rail branching from the first straight rail to extend to the second straight rail perpendicularly facing the first straight rail or branching from the second straight rail to extend to the first straight rail perpendicularly facing the first straight rail, and a steering rail disposed in a branch area branching from the first straight rail or a branch area branching from the second straight rail such that the traveling portion enters the branch rail from the first straight rail or enters the branch rail from the second straight rail, the traveling portion may include a traveling wheel traveling along the first straight rail, the second straight rail, and the branch rail, and a steering wheel traveling along the steering rail, and when the steering wheel is configured to be disposed above the branch rail, the steering wheel may be configured to be connected to the steering rail through upward movement and to travel along the steering rail in a desired direction through lateral movement.

In example embodiments, the connecting rail may be configured to connect between the first straight rail and the second straight rail, which perpendicularly face each other, to form a curved path between the first straight rail and the second straight rail such that the curved path is formed between a point of about ½ length of the first straight rail and a point of about ½ length of the second straight rail, which perpendicularly face each other.

In example embodiments, the mounting portion may be configured to have a structure that is movably suspended by a guide portion disposed under the traveling portion, the guide portion may include a guide plate configured to be connected to the traveling portion and to have a guide groove adjacent to the mounting portion, and a guide rod configured to be connected to the mounting portion and to move along the guide groove, and the guide groove may be configured to have a structure extending from a center of the guide plate toward both ends of the guide plate, in which at least two guide grooves may extend toward the both ends of the guide plate from the center of the guide plate.

In order to accomplish the object of the present disclosure, an article transport apparatus according to example embodiments of the present disclosure includes a traveling portion configured to travel along a rail portion, and a mounting portion configured to have a structure suspended under a traveling portion to mount articles thereon, wherein the rail portion includes a plurality of first straight rails extending in a first direction while being arranged parallel to each other at first intervals, a plurality of second straight rails extending in a second direction perpendicular to the first direction while being arranged parallel to each other at second intervals, and a connecting rail configured to connect between the first straight rails and the second straight rails, which perpendicularly face each other, to form an oblique path between the first straight rails and the second straight rails so that the traveling portion travels between the first straight rails and the second straight rails perpendicularly facing each other.

In example embodiments, when the connecting rail is configured to have an oblique path extending over the first straight rail and over the second straight rail, which perpendicularly face each other, the traveling portion may include a traveling wheel traveling along the first straight rail and the second straight rail, and a steering wheel traveling along the connecting rail, and the steering wheel may be configured to be connected to the connecting rail through upward movement and to travel along the connecting rail in a desired direction through lateral movement.

In example embodiments, when the connecting rail includes a branch rail branching from the first straight rail to extend to the second straight rail perpendicularly facing the first straight rail or branching from the second straight rail to extend to the first straight rail perpendicularly facing the first straight rail, and a steering rail disposed in a branch area branching from the first straight rail or a branch area branching from the second straight rail such that the traveling portion enters the branch rail from the first straight rail or enters the branch rail from the second straight rail, the traveling portion may include a traveling wheel traveling along the first straight rail, the second straight rail, and the branch rail, and a steering wheel traveling along the steering rail, and when the steering wheel is configured to be disposed above the branch rail, the steering wheel may be configured to be connected to the steering rail through upward movement and to travel along the steering rail in a desired direction through lateral movement.

In example embodiments, the connecting rail may be configured to connect between the first straight rail and the second straight rail, which perpendicularly face each other, to form an oblique path between the first straight rail and the second straight rail such that the oblique path is formed between a point of about ½ length of the first straight rail and a point of about ½ length of the second straight rail, which perpendicularly face each other.

In example embodiments, the mounting portion may be configured to have a structure that is movably suspended by a guide portion disposed under the traveling portion, the guide portion may include a guide plate configured to be connected to the traveling portion and to have a guide groove adjacent to the mounting portion, and a guide rod configured to be connected to the mounting portion and to move along the guide groove, and the guide groove may be configured to have a structure extending from a center of the guide plate toward both ends of the guide plate, in which at least two guide grooves may extend toward the both ends of the guide plate from the center of the guide plate.

The article transport apparatus according to example embodiments of the present disclosure can easily match the position where the mounting portion vertically ascends and descends to the position of the port and the shelf without performing an additional process so that the overall process time for manufacturing the integrated circuit devices can be shortened. Therefore, the article transport apparatus according to example embodiments can improve productivity in the manufacturing process for the integrated circuit devices. In particular, the article transport apparatus according to example embodiments of the present disclosure can secure the compact travel path of the rail portion and can provide a movable mounting portion, so that the position where the mounting portion vertically ascends and descends can easily match to the position of the port and the shelf.

However, the effects of the present disclosure are not limited to the above-mentioned effects, and may be expanded in various ways without departing from the spirit and scope of the present disclosure.

DETAILED DESCRIPTION OF THE EMBODIMENTS

Figure 1:
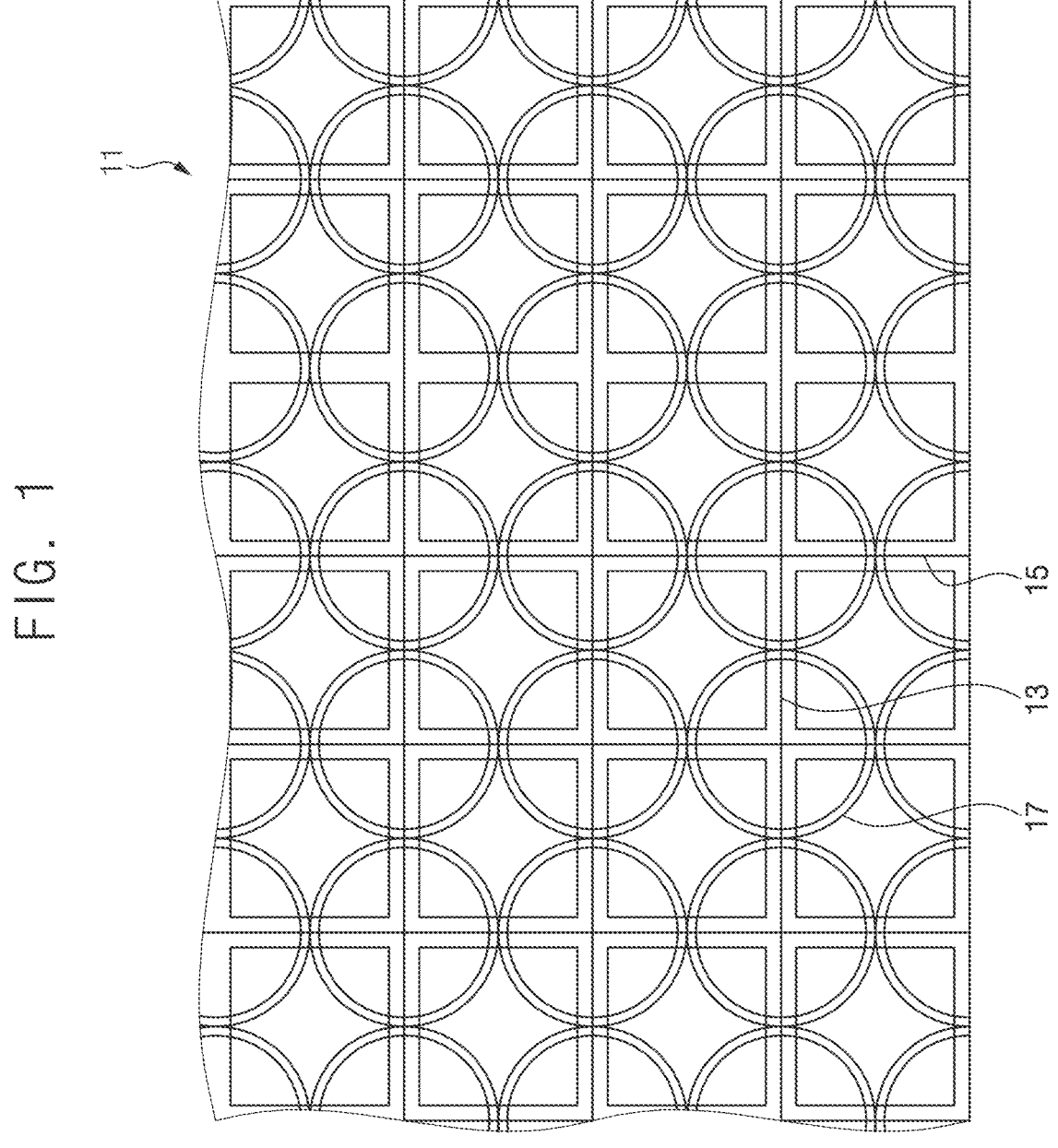
FIGS. 1 and 2 are schematic views for explaining a rail portion in an article transport apparatus according to example embodiments of the present disclosure.

The present disclosure may be variously modified and have various embodiments, and the embodiments are described in detail through the detailed description. This, however, is by no means to restrict the present disclosure to a specific disclosed form, and the present disclosure shall be construed as including all modifications, equivalents, and substitutes within the idea and technical scope of the present disclosure. The same reference numerals have been used for the same elements in describing each figure. Terms such as "first" and "second" may be used to describe various elements, but the elements may not be limited by the terms. These terms are only used for the purpose of distinguishing one element from another element. Terms used in this application are only used to describe specific embodiments, and are not intended to limit the present disclosure. Singular expressions include plural expressions unless the context clearly dictates otherwise. In the present application, the terms "comprise" or "consisting of" are intended to designate that there is a feature, number, step, operation, component, part, or combination thereof described in the specification, but one or more other features It should be understood that it does not preclude the possibility of the presence or addition of numbers, steps, operations, components, parts, or combinations thereof.

Unless otherwise defined, all terms, including technical or scientific terms, used herein have the same meaning as how they are generally understood by a person having ordinary skill in the art to which the present disclosure pertains. Any term as defined in a general dictionary shall be construed as having the same meaning as in the context of the relevant art, and shall not be interpreted as having an idealistic or excessively formalistic meaning unless explicitly defined otherwise in the present disclosure.

Hereinafter, embodiments of the present disclosure will be described in more detail with reference to the accompanying drawings. The same reference numerals will be used for the same elements in the drawings, and redundant descriptions of the same elements will be omitted.

First, an article transport apparatus according to example embodiments of the present disclosure is used for transporting articles such as FOUP for accommodating a plurality of substrates during a manufacturing process of integrated circuit devices such as a semiconductor device, a display device, and the like, and may be an overhead hoist transport (OHT) which is mainly provided on the ceiling side of a manufacturing line of the integrated circuit devices. Accordingly, the article transport apparatus according to example embodiments may be configured to transport articles by vertically ascending and descending between a plurality of ports provided in an apparatus for manufacturing an integrated circuit device and a plurality of shelves provided in a stocker for storing the articles. In addition, the article transport apparatus according to example embodiments may be configured to have a structure including a traveling portion, a rail portion, a mounting portion, a guide portion, and the like.

Hereinafter, the traveling portion, the rail portion, the mounting portion, the guide portion, and the like in the article transport apparatus according to example embodiments of the present disclosure will be described in more detail.

Figure 2:
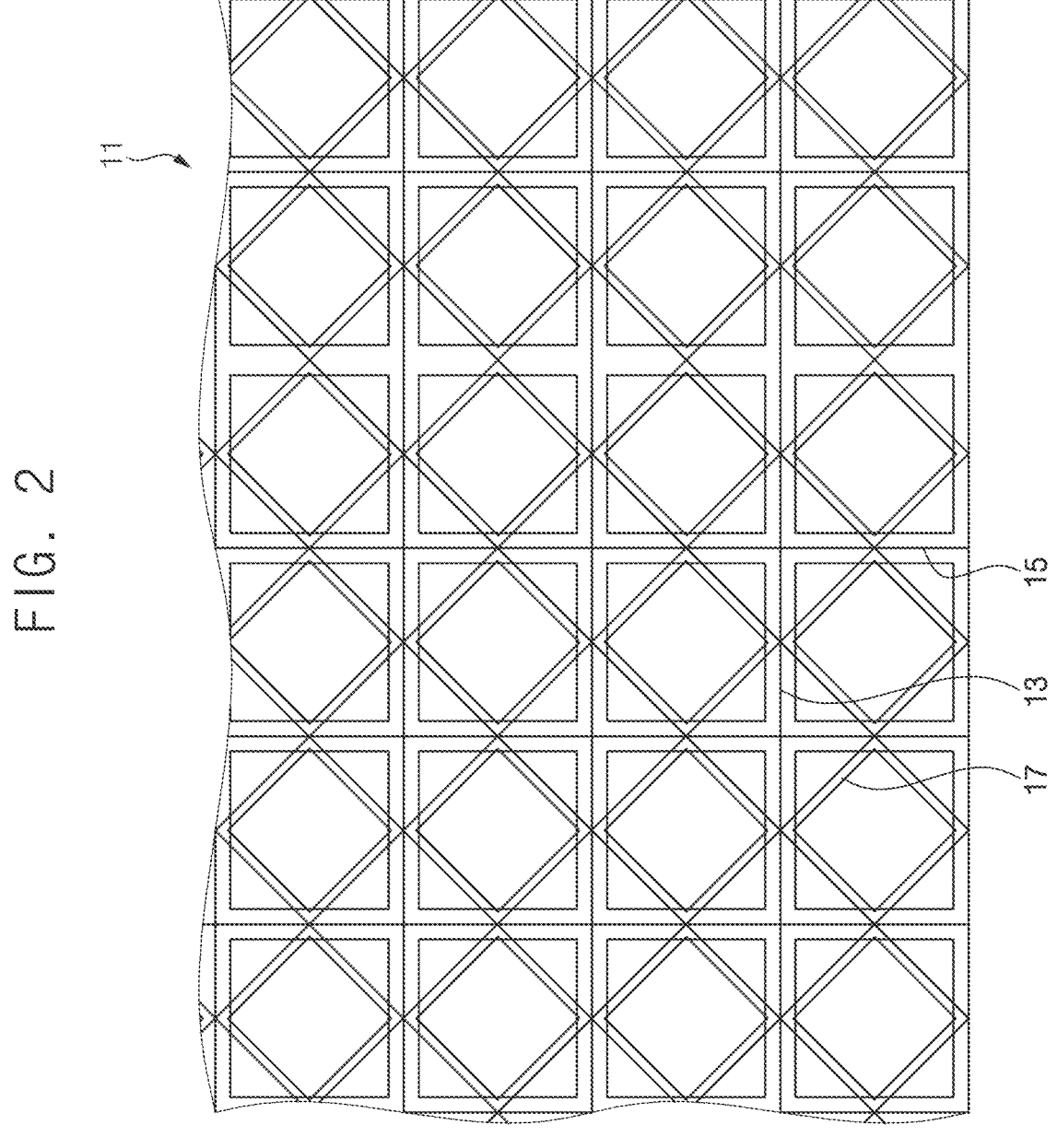

FIGS. 1 and 2 are schematic views for explaining the rail portion in the article transport apparatus according to example embodiments of the present disclosure.

Referring to FIGS. 1 and 2, a rail portion 11 of the article transport apparatus according to example embodiments may provide a travel path, and may include a first straight rail 13, a second straight rail 15, and a connecting rail 17.

The first straight rail 13 may be provided to extend in the first direction, and a plurality of first straight rails 13 may be provided while being arranged parallel to each other at first intervals, for example, a plurality of first straight rails 13 may be provided parallel to each other in the horizontal direction of the ceiling surface at first intervals.

The second straight rail 15 may be provided to extend in the second direction perpendicular to the first direction, and a plurality of second straight rails 15 may be provided parallel to each other at second intervals, for example, a plurality of second straight rails 15 may be provided parallel to each other in the vertical direction of the ceiling surface at second intervals.

In example embodiments, the first interval may be substantially equal to the second interval. Accordingly, the rail portion 11 formed by the first straight rail 13 and the second straight rail 15 in the present disclosure may have a checkerboard structure, in which horizontal and vertical intervals are equal to each other, on the ceiling surface. When the first interval and the second interval are narrower, the rail portion 11 may have a more compact arrangement.

The connecting rail 17 is provided to connect the first straight rail 13 and the second straight rail 15, and the first straight rail 13 and the second straight rail 15 may be configured to perpendicularly face each other.

The connecting rail 17 in example embodiments may be configured to connect between the first straight rail 13 and the second straight rail 15 that are perpendicularly adjacent to each other, in detail, the connecting rail 17 may connect between a point of about ½ length of the first straight rail 13 and a point of about ½ length of the second straight rail 15 that are perpendicularly adjacent to each other. That is, the connecting rail 17 in the present disclosure may connect between the first straight rail 13 and the second straight rail 15 that perpendicularly face each other while crossing each other, and may connect a point of about ½ length of the first straight rails 13 arranged parallel to each other and a point of about ½ length of the second straight rails 15 arranged parallel to each other.

Meanwhile, the connecting rail 17 in the rail portion 11 of the article transport apparatus according to example embodiments may connect between the first straight rail 13 and the second straight rail 15 such that a curved path or an oblique path may be formed between the first straight rail 13 and the second straight rail 15. That is, as shown in FIG. 1, the connecting rail 17 in the rail portion 11 of the article transport apparatus according to example embodiments of the present disclosure may be prepared in the form of a curved rail that may connect between the first straight rail 13 and the second straight rail 15, which are perpendicularly adjacent to each other, such that a curved path may be formed between the first straight rail 13 and the second straight rail 15, or as shown in FIG. 2, the connecting rail 17 may be prepared in the form of an oblique rail that may connect between the first straight rail 13 and the second straight rail 15, which are perpendicularly adjacent to each other, such that an oblique path may be formed between the first straight rail 13 and the second straight rail 15.

Specifically, as shown in FIG. 1, the connecting rail 17 may be prepared in the form of a circular rail having a circular path in which the circular path has the center point at the intersection point between the first straight rail 13 and the second straight rail 15 perpendicularly adjacent to each other, and a radius corresponding to about ½ length of the first straight rails 13 arranged parallel to each other or about ½ length of the second straight rails 15 arranged parallel to each other, and the circular rail having the circular path in which the circular path has the center point at the intersection point between the first straight rail 13 and the second straight rail 15, and the radius corresponding to about ½ length of the first straight rail 13 or about ½ length of the second straight rail 15 may be repeatedly arranged between the first straight rail 13 and the second straight rail 15.

In addition, as shown in FIG. 2, the connecting rail 17 may be prepared in the form of an oblique rail having a rectangular path in which the rectangular path has the center point at the intersection point between the first straight rail 13 and the second straight rail 15 perpendicularly adjacent to each other, and a side length corresponding to about ½ length of the first straight rails 13 arranged parallel to each other or about ½ length of the second straight rails 15 arranged parallel to each other, and the oblique rail having the rectangular path of a diamond structure in which the rectangular path has the center point at the intersection point between the first straight rail 13 and the second straight rail 15, and the side length corresponding to about ½ length of the first straight rail 13 or about ½ length of the second straight rail 15 may be repeatedly arranged between the first straight rail 13 and the second straight rail 15.

Alternatively, although not shown in the drawings, the connecting rail 17 may have a mixed path defined by a circular rail having a curved path and an oblique rail having an oblique path between the first straight rail 13 and the second straight rail 15.

In this way, the article transport apparatus according to example embodiments may have a structure in which the first straight rail 13 and the second straight rail 15 are disposed perpendicular to each other and the connecting rail 17 having a circular path and/or an oblique path connecting between the first straight rail 13 and the second straight rail 15 is repeatedly arranged between the first straight rail 13 and the second straight rail 13 so that the travel path defined by the rail portion 11 may become more compact.

In addition, the connecting rail 17 in the article transport apparatus according to example embodiments may be configured to have a structure branching from each of the first straight rail 13 and the second straight rail 15.

Figure 3:
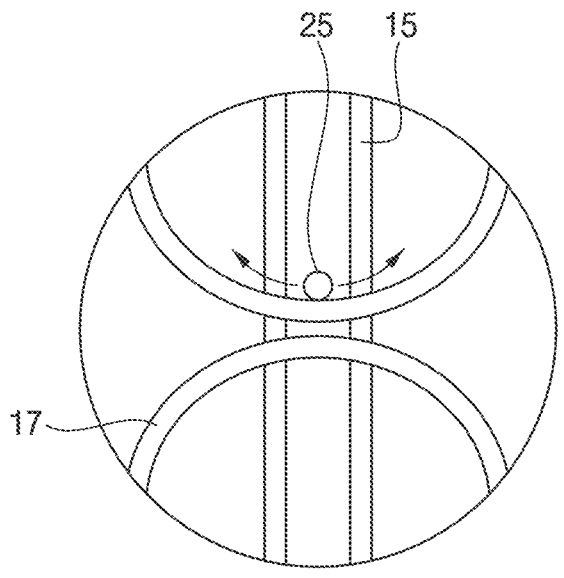
FIGS. 3 and 4 are schematic views for explaining a connecting rail in a traveling portion of an article transport apparatus according to example embodiments of the present disclosure.
Figure 4:
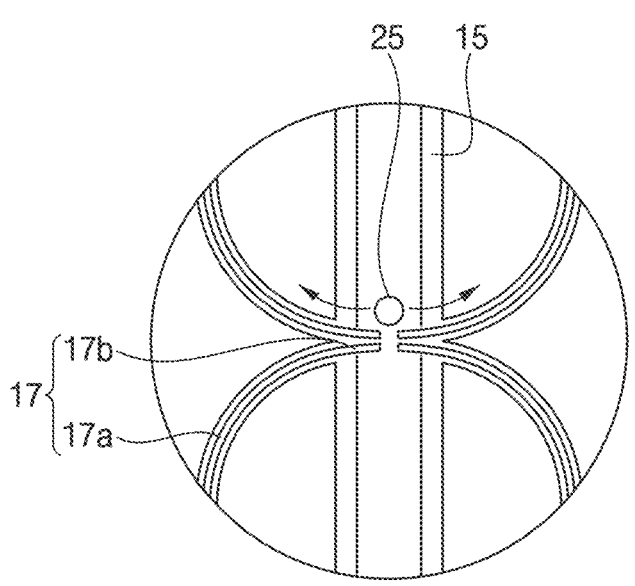

FIGS. 3 and 4 are schematic views for explaining the connecting rail in the traveling portion of the article transport apparatus according to example embodiments of the present disclosure.

First, referring to FIG. 3, the connecting rail 17 in the traveling portion 21 of the article transport apparatus according to example embodiments may be configured to have a path extending over the first straight rail 13 and over the second straight rail 15, which perpendicularly face each other. That is, the connecting rail 17 shown in FIG. 3 does not directly connect the first straight rail 13 and the second straight rail 15 perpendicularly facing each other, but the connecting rail 17 has a structure extending through over the first straight rail 13 and over the second straight rail 15. Therefore, the article transport apparatus according to example embodiments may travel along the first straight rail 13 or the second straight rail 15 and then travel along the connecting rail 17 extending over the first straight rail 13 and over the second straight rail 15 according to the upward movement of the steering wheel 25 in the traveling portion 21, which will be described below.

In addition, the connecting rail 17 in the present disclosure may be configured to have a structure extending over the first straight rail 13 and over the second straight rail 15 perpendicularly facing each other along a curved path or an oblique path.

Alternatively, referring to FIG. 4, the connecting rail 17 in the traveling portion 21 of the article transport apparatus according to example embodiments may include a branch rail 17*a* and a steering rail 17*b*, in which the branch rail 17*a* may be configured to have a structure branching from the first straight rail 13 or the second straight rail 15, and the steering rail 17*b* may be configured to have a structure capable of allowing the traveling portion 21 to enter the branch rail 17*a* from the first straight rail 13 or to enter the branch rail 17*a* from the second straight rail 15.

In the present disclosure, since the connecting rail 17 is configured to connect the first straight rail 13 and the second straight rail 15 that perpendicularly face each other, the branch rail 17*a* may be configured to branch from the first straight rail 13 to extend to the second straight rail 15 which are perpendicularly face each other, or to branch from the second straight rail 15 to the first straight rail 13 which are perpendicularly face each other. That is, the branch rail 17*a* in the present disclosure may have a structure branching from the first straight rail 13 to extend to the second straight rail 15, which perpendicularly face each other, or have a structure branching from the second straight rail 15 to extend to the first straight rail 13, which perpendicularly face each other, so the branch rail 17*a* has the structure substantially the same as the structure of the connecting rail 17.

In addition, the steering rail 17*b* is provided to allow the traveling portion 21 traveling along the first straight rail 13 or the second straight rail 15 to travel along the branch rail 17*a*, and may be configured to extend from the first straight rail 13 to the second straight rail 15 along the branch rail 17*a*, or to be branched from the second straight rail 15 to extend to the first straight rail 13.

Alternatively, although not shown in the drawings, the steering rail 17*b* may be configured to have a structure disposed in a branch area branching from the first straight rail 13 or in a branch area branching from the second straight rail 15. That is, the steering rail 17*b* does not extend along the branch rail 17*a*, but may be disposed at an inlet side of the branch rail 17*a* branching from the first straight rail 13, which is a branch area branching from the first straight rail 13, or at an inlet side of the branch rail 17*a* branching from the second straight rail 15, which is a branch area branching from the second straight rail 15.

In addition, as shown in FIG. 1, when the connecting rail 17 is a curved rail having a curved path, the branch rail 17*a* may also be branched from the first straight rail 13 to extend to the second straight rail 15, which perpendicularly face each other, to have a curved path or branched from the second straight rail 15 to extend to the first straight rail 13, which perpendicularly face each other, to have a curved path, and the steering rail 17*b* may also be configured to have a curved path along the branch rail 17*a*.

However, in the case of the steering rail 17*b*, the curved path may be provided only in the branch area branching from the first straight rail 13 or only in the branch area branching from the second straight rail 15. In addition, as shown in FIG. 2, when the connecting rail 17 is an oblique rail having an oblique path, the branch rail 17*a* may also be branched from the first straight rail 13 to extend to the second straight rail 15, which perpendicularly face each other, to have an oblique path or branched from the second straight rail 15 to extend to the first straight rail 13, which perpendicularly face each other, to have a curved path, and the steering rail 17*b* may also be configured to have an oblique path along the branch rail 17*a*.

Similarly, in the case of the steering rail 17*b*, the oblique path may be provided only in the branch area branching from the first straight rail 13 or only in the branch area branching from the second straight rail 15. In this way, the article transport apparatus according to example embodiments may allow the traveling portion 21 to easily travel along the connecting rail 17 from the first straight rail 13 or allow the traveling portion 21 to easily travel along the connecting rail 17 from the second straight rail 15, as a result, the compact travel path may be secured, so the travel portion 21 may be positioned in a desired location by the rail portion 11.

Figure 5:
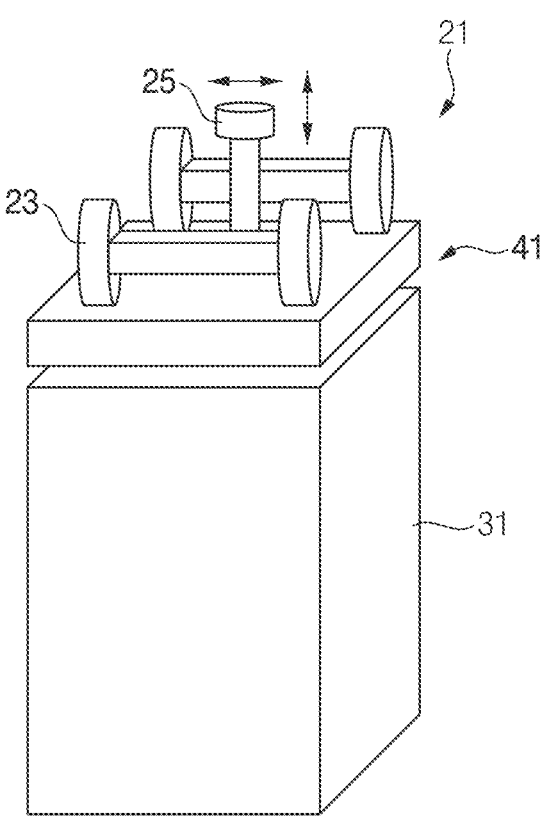
FIG. 5 is a schematic view for explaining a traveling portion and a mounting portion in an article transport apparatus according to example embodiments of the present disclosure.

FIG. 5 is a schematic view for explaining a traveling portion and a mounting portion in an article transport apparatus according to example embodiments of the present disclosure.

Referring to FIG. 5, the traveling portion 21 in the article transport apparatus according to example embodiments may include a traveling wheel 23 and a steering wheel 25. As shown in FIG. 3, when the connecting rail 17 is configured to have a path extending over the first straight rail 13 and over the second straight rail 15, the traveling wheel 23 may be configured to travel the first straight rail 13 and the second straight rail 15 and the steering wheel 25 may be configured to travel the connecting rail 17, and as shown in FIG. 4, when the connecting rail 17 includes the branch rail 17*a* and the steering rail 17*b*, the traveling wheel 23 may be configured to travel along the first straight rail 13, the second straight rail 15, and the branch rail 17*a*, and the steering wheel 25 may be configured to travel along the steering rail 17*b*.

Specifically, as shown in FIG. 3, when the connecting rail 17 has a path extending over the first straight rail 13 and over the second straight rail 15, the steering wheel 25 may be configured to be connected to the connecting rail 17 through the upward movement, and to travel along the connecting rail 17 in a desired direction through the lateral movement.

Therefore, while traveling along the second straight rail 15 using the traveling wheel 23, when the steering wheel 25 is positioned below the connecting rail 17, the steering wheel 25 may move up to connect the traveling wheel 23 to the connecting rail 17. In addition, the traveling wheel 23 may travel along the left connecting rail 17 by moving the steering wheel 25 to the left connecting rail 17 or travel along the right connecting rail 17 by moving the steering wheel 25 to the right connecting rail 17. Furthermore, while traveling along the connecting rail 17 using the traveling wheel 23, when it is positioned above the first straight rail 13 perpendicularly facing the second straight rail 15, the steering wheel 25 may move down to connect the traveling wheel 23 to the first straight rail 13 so that the traveling wheel 23 may move along the first straight rail 13. In addition, in the case of FIG. 4, the steering rail 17*b* may be provided above the branch rail 17*a*.

Accordingly, the steering wheel 25 may be configured to move up and down toward the steering rail 17*b* when entering and exiting the branch region, and also move to the left and right toward the steering rail 17*b* located in the desired steering direction. Therefore, while traveling along the second straight rail 15 using the traveling wheel 23, when the steering wheel 25 is positioned below the steering rail 17*b*, the steering wheel 25 may move up to connect the traveling wheel 23 to the steering rail 17*b*. In addition, the traveling wheel 23 may travel along the left steering rail 17*b* by moving the steering wheel 25 to the left steering rail 17*b* or travel along the right steering rail 17*b* by moving the steering wheel 25 to the right steering rail 17*b*. Further, while traveling along the steering rail 17*b* using the traveling wheel 23, when it is positioned above the first straight rail 13 perpendicularly facing the second straight rail 15, the steering wheel 25 may move down to connect the traveling wheel 23 to the first straight rail 13 so that the traveling wheel 23 may move along the first straight rail 13.

However, when the steering rail 17b is disposed above the branch rail 17a and provided only in the branch area, the steering wheel 25 may only have a steering function through left and right movement, and the traveling wheel 23 may travel along the branch rail 17a. In this case, the steering wheel 25 may be configured to have a structure that moves left and right. In this way, since the article transport apparatus according to example embodiments may be configured to have a structure in which the rail portion 11 is more compact to allow the traveling portion 21 to easily travel, the traveling portion 21 may be located in a desired place. In addition, the mounting portion 31 may be configured to have a structure suspended under the traveling portion 21, and may be configured to mount articles used for manufacturing an integrated circuit device.

Examples of the articles in the present disclosure may include FOUP for stacking a plurality of substrates for manufacturing an integrated circuit device.

In addition, the mounting portion 31 may be configured to transport the articles by vertically ascending and descending between a plurality of ports and a shelf of a stocker of a manufacturing device disposed on an integrated circuit manufacturing line. Although not shown in the drawings, the mounting portion 31 may be provided with a lifting member such as a hoist capable of vertically ascending and descending between a plurality of ports and a shelf of a stocker of a manufacturing device. Therefore, the article transport apparatus according to example embodiments may transport the articles by placing the traveling portion 21 vertically above the port and the shelf, which are places for loading and unloading the articles, and then vertically ascending and descending the mounting portion 31.

In particular, the article transport apparatus according to example embodiments may be configured to have a structure in which the rail portion 11 has a compact configuration to allow the traveling portion 21 to easily travel, so that the traveling portion 21 may be located in a desired place and the position of the traveling portion 21 may be easily adjusted with respect to the ports, shelves, and the like mentioned above.

Hereinafter, the description will be made in detail with respect to the structure in which the mounting portion 31 is movably suspended to the traveling portion in the article transport apparatus according to example embodiments of the present disclosure.

Figure 6:
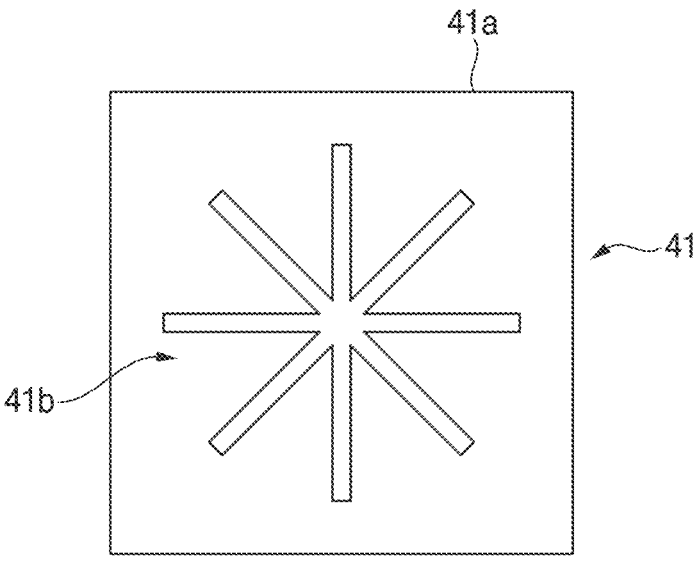
FIGS. 6 and 7 are schematic views for explaining a guide portion in an article transport apparatus according to example embodiments of the present disclosure.
Figure 7:
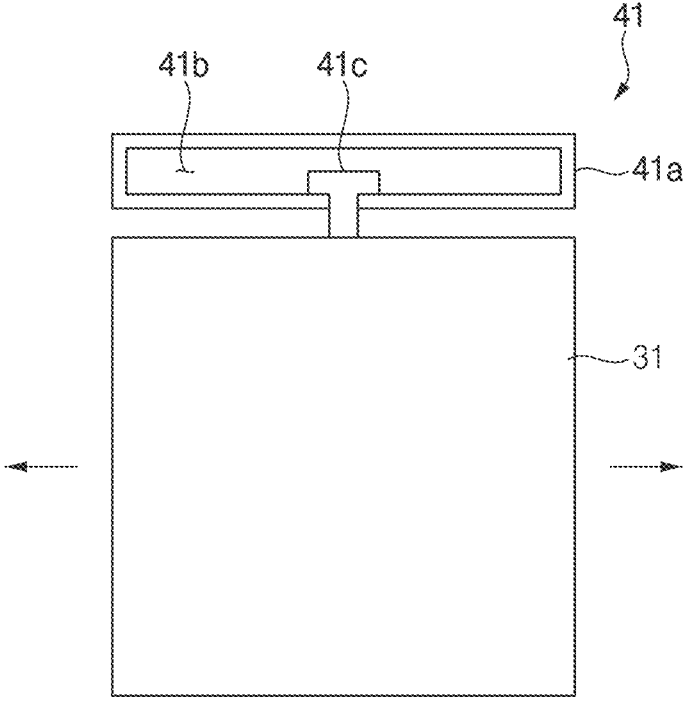
Figure 8:
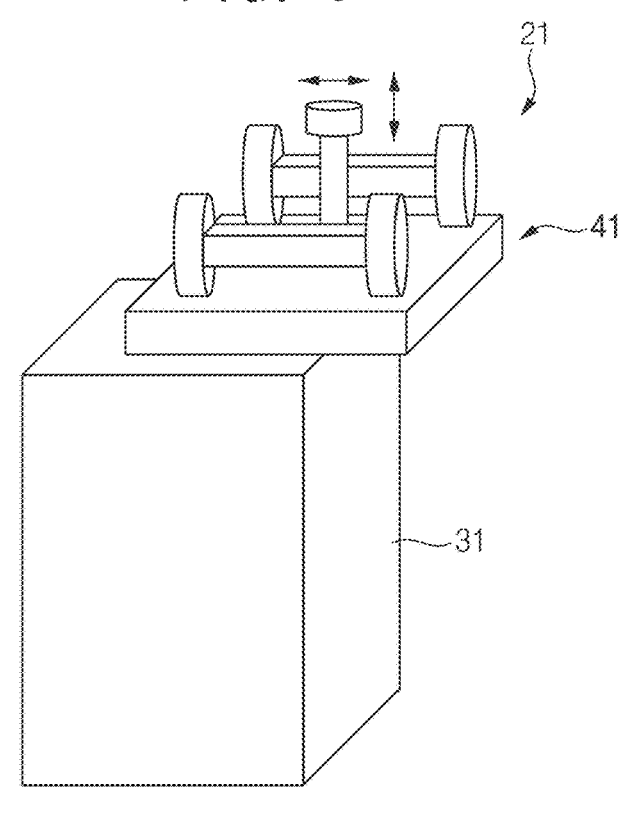
FIGS. 8 and 9 are schematic views for explaining a mounting portion moved by a guide portion in an article transport apparatus according to example embodiments of the present disclosure.
Figure 9:
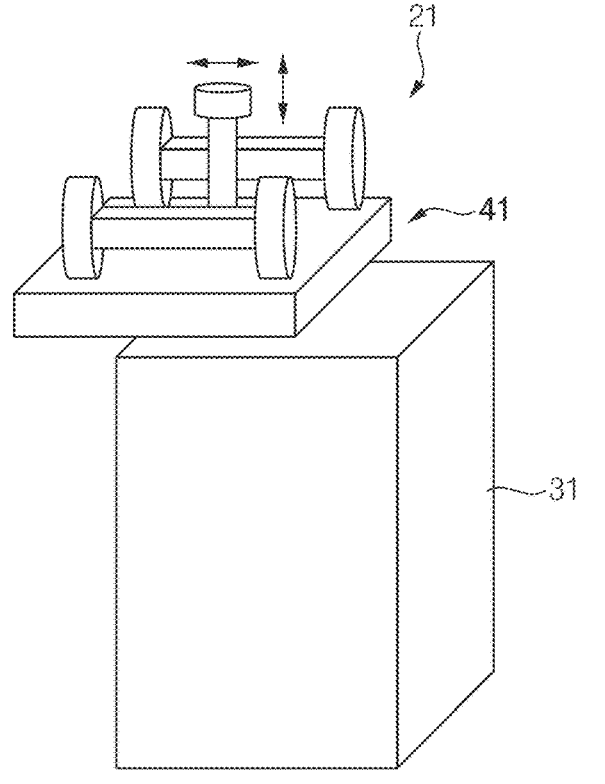

FIGS. 6 and 7 are schematic views for explaining a guide portion in an article transport apparatus according to example embodiments of the present disclosure. FIGS. 8 and 9 are schematic view for explaining a mounting portion moved by a guide portion in an article transport apparatus according to example embodiments of the present disclosure.

First, referring to FIGS. 6 and 7, the mounting portion 31 in the article transport apparatus according to example embodiments may be configured to have a structure suspended to the guide portion 41 disposed under the traveling portion 21.

Particularly, the guide portion 41 in the article transport apparatus may be configured to have a structure to which the mounting portion 31 disposed under the traveling portion 21 is movably suspended.

Accordingly, the guide portion 41 may be configured to have a structure that can be easily moved even when the mounting portion 31 is suspended thereto, and may include a guide plate 41a and a guide rod 41c.

The guide plate 41a may be configured to be connected to the traveling portion 21 and to have a guide groove 41b adjacent to the mounting portion 31, and the guide rod 41c may be connected to the mounting portion 31 to move along the guide groove 41b. In addition, the guide groove 41b may be configured to have a structure extending from the center of the guide plate 41a toward both ends of the guide plate 41a, in which at least two guide grooves 41b extend from the center of the guide plate 41a toward both ends of the guide plate 41a. The guide groove 41b may be configured to extend in eight directions. Therefore, as the guide rod 41c connected to the mounting portion 31 moves along the guide groove 41b, the mounting portion 31 may be easily moved even in a suspended state under the traveling portion 21. As shown in FIGS. 8 and 9, the mounting portion 31 may be easily moved in a desired direction while being suspended under the traveling portion 21.

In this way, the article transport apparatus according to the example embodiments can secure the compact travel path defined by the rail portion 11 and can provide the movable mounting portion 31, so that the position where the mounting portion 31 vertically ascends and descends can easily match to the position of the port and shelf. That is, the article transport apparatus according to example embodiments can improve the freedom of movement of the traveling portion 21 through the rail portion 11 that secures more compact structure, and can ensure the flexibility according to the position adjustment between the mounting portion 31 and the port and shelf, so that the position where the mounting portion 31 vertically ascends and descends can easily match to the position of the port and the shelf without performing a separate operation.

Since the article transport apparatus according to example embodiments can be used in the transport process for transporting articles such as FOUP that accommodates a plurality of substrates for manufacturing integrated circuit devices, the article transport apparatus can be applied more actively to the manufacture of the integrated circuit devices such as semiconductor devices, the display devices, and the like.

Although it has been described with reference to example embodiments of the present disclosure, it will be understood by those skilled in the art that various modifications and variations are possible without departing from the idea and scope of the present disclosure described in the claims.

What is claimed is:

1. An article transport apparatus comprising:
a traveling portion configured to travel along a rail portion; and
a mounting portion configured to have a structure suspended under the traveling portion and to mount articles thereon,
wherein the rail portion includes a plurality of first straight rails extending in a first direction while being arranged parallel to each other at first intervals, a plurality of second straight rails extending in a second direction perpendicular to the first direction while being arranged parallel to each other at second intervals, and connecting rails configured to connect between the first straight rails and the second straight rails, which perpendicularly face each other, so that the traveling portion travels between the first straight rails and the second straight rails perpendicularly facing each other, and wherein the traveling portion includes a steering wheel configured to move up and down and to be selectively connected to the connecting rails through an upward or downward movement and to travel along the connecting rails in a desired direction through lateral movement.

2. The article transport apparatus of claim 1, wherein, when the connecting rails are configured to each have a path extending over one of the first straight rails and over one of the second straight rails, which perpendicularly face each other, the traveling portion includes a traveling wheel traveling along the first straight rails and the second straight rails.

3. The article transport apparatus of claim 1, wherein, when the connecting rails include a branch rail branching from one of the first straight rails to extend to one of the second straight rails perpendicularly facing the first straight rail or branching from the second straight rail to extend to the first straight rail perpendicularly facing the second straight rail, and a steering rail disposed in a branch area branching from the first straight rail or a branch area branching from the second straight rail such that the traveling portion enters the branch rail from the first straight rail or enters the branch rail from the second straight rail, the traveling portion includes a traveling wheel traveling along the first straight rail, the second straight rail, and the branch rail, and the steering wheel traveling along the steering rail.

4. The article transport apparatus of claim 3, wherein, the steering rail is configured to be disposed above the branch rail.

5. The article transport apparatus of claim 1, wherein the connecting rails are configured to connect between the first straight rails and the second straight rails which are perpendicularly adjacent to each other.

6. The article transport apparatus of claim 5, wherein each of the connecting rails are configured to connect between a point of about ½ length of one of the first straight rails and a point of about ½ length of one of the second straight rails, which are perpendicularly adjacent to each other.

7. The article transport apparatus of claim 1, wherein the mounting portion is configured to have a structure that is movably suspended by a guide portion disposed under the traveling portion.

8. The article transport apparatus of claim 7, wherein the guide portion includes a guide plate configured to be connected to the traveling portion and to have a guide groove adjacent to the mounting portion, and a guide rod configured to be connected to the mounting portion and to move along the guide groove.

9. The article transport apparatus of claim 8, wherein the guide groove is configured to have a structure extending from a center of the guide plate toward both ends of the guide plate, in which at least two guide grooves extend toward the both ends of the guide plate from the center of the guide plate.

10. The article transport apparatus of claim 1, wherein the first intervals are equal to the second intervals.

11. An article transport apparatus comprising:

a traveling portion configured to travel along a rail portion; and a mounting portion configured to have a structure suspended under the traveling portion to mount articles thereon, wherein the rail portion includes a plurality of first straight rails extending in a first direction while being arranged parallel to each other at first intervals, a plurality of second straight rails extending in a second direction perpendicular to the first direction while being arranged parallel to each other at second intervals, and a connecting rail configured to connect between the first straight rails and the second straight rails, which perpendicularly face each other, to form a curved path between the first straight rails and the second straight rails so that the traveling portion travels between the first straight rails and the second straight rails perpendicularly facing each other, and wherein the traveling portion includes a steering wheel configured to move up and down and to be selectively connected to the connecting rail through an upward or downward movement and to travel along the connecting rail in a desired direction through lateral movement.

12. The article transport apparatus of claim 11, wherein, when the connecting rail is configured to have a curved path extending over one of the first straight rails and over one of the second straight rails, which perpendicularly face each other, the traveling portion includes a traveling wheel traveling along the first straight rails and the second straight rails.

13. The article transport apparatus of claim 11, wherein, when the connecting rail includes a branch rail branching from one of the first straight rails to extend to one of the second straight rails perpendicularly facing the first straight rail or branching from the second straight rail to extend to the first straight rail perpendicularly facing the second straight rail, and a steering rail disposed in a branch area branching from the first straight rail or a branch area branching from the second straight rail such that the traveling portion enters the branch rail from the first straight rail or enters the branch rail from the second straight rail, the traveling portion includes a traveling wheel traveling along the first straight rail, the second straight rail, and the branch rail, and the steering wheel is configured to be disposed above the branch rail.

14. The article transport apparatus of claim 11, wherein the connecting rail is configured to connect between one of the first straight rails and one of the second straight rails, which perpendicularly face each other, to form a curved path between the first straight rail and the second straight rail such that the curved path is formed between a point of about ½ length of the first straight rail and a point of about ½ length of the second straight rail, which perpendicularly face each other.

15. The article transport apparatus of claim 11, wherein the mounting portion is configured to have a structure that is movably suspended by a guide portion disposed under the traveling portion, the guide portion includes a guide plate configured to be connected to the traveling portion and to have a guide groove adjacent to the mounting portion, and a guide rod configured to be connected to the mounting portion and to move along the guide groove, and the guide groove is configured to have a structure extending from a center of the guide plate toward both ends of the guide plate, in which at least two guide grooves extend toward the both ends of the guide plate from the center of the guide plate.

16. An article transport apparatus comprising:

a traveling portion configured to travel along a rail portion; and a mounting portion configured to have a structure suspended under the traveling portion to mount articles thereon, wherein the rail portion includes a plurality of first straight rails extending in a first direction while being arranged parallel to each other at first intervals, a plurality of second straight rails extending in a second direction perpendicular to the first direction while being arranged parallel to each other at second intervals, and a connecting rail configured to connect between the first straight rails and the second straight rails, which perpendicularly face each other, to form an oblique path between the first straight rails and the second straight rails so that the traveling portion travels between the first straight rails and the second straight rails perpendicularly facing each other, and wherein the traveling portion includes a steering wheel configured to move up and down and to be selectively connected to the connecting rail through an upward or downward movement and to travel along the connecting rail in a desired direction through lateral movement.

17. The article transport apparatus of claim 16, wherein, when the connecting rail is configured to have an oblique path extending over one of the first straight rails and over one of the second straight rails, which perpendicularly face each other, the traveling portion includes a traveling wheel traveling along the first straight rail and the second straight rail, the steering wheel is configured to be connected to the connecting rail through the upward movement.

18. The article transport apparatus of claim 16, wherein, when the connecting rails include a branch rail branching from one of the first straight rails to extend to one of the second straight rails perpendicularly facing the first straight rail or branching from the second straight rail to extend to the first straight rail perpendicularly facing the second straight rail, and a steering rail disposed in a branch area branching from the first straight rail or a branch area branching from the second straight rail such that the traveling portion enters the branch rail from the first straight rail or enters the branch rail from the second straight rail, the traveling portion includes a traveling wheel traveling along the first straight rails, the second straight rails, and the branch rail, and the steering wheel is configured to be disposed above the branch rail.

19. The article transport apparatus of claim 16, wherein the connecting rails are configured to connect between one of the first straight rails and one of the second straight rails, which perpendicularly face each other, to form an oblique path between the first straight rail and the second straight rail such that the oblique path is formed between a point of about ½ length of the first straight rail and a point of about ½ length of the second straight rail, which perpendicularly face each other.

20. The article transport apparatus of claim 16, wherein the mounting portion is configured to have a structure that is movably suspended by a guide portion disposed under the traveling portion, the guide portion includes a guide plate configured to be connected to the traveling portion and to have a guide groove adjacent to the mounting portion, and a guide rod configured to be connected to the mounting portion and to move along the guide groove, and the guide groove is configured to have a structure extending from a center of the guide plate toward both ends of the guide plate, in which at least two guide grooves extend toward the both ends of the guide plate from the center of the guide plate.

\* \* \* \* \*